(12) United States Patent
Kirscht et al.

(10) Patent No.: US 7,887,633 B2
(45) Date of Patent: Feb. 15, 2011

(54) GERMANIUM-ENRICHED SILICON MATERIAL FOR MAKING SOLAR CELLS

(75) Inventors: Fritz Kirscht, Berlin (DE); Vera Abrosimova, Berlin (DE); Matthias Heuer, Berlin (DE); Anis Jouini, Grenoble (FR); Dieter Linke, Berlin (DE); Martin Kaes, Berlin (DE); Jean Patrice Rakotoniaina, Berlin (DE); Kamel Ounadjela, Belmont, CA (US)

(73) Assignee: Calisolar, Inc., Sunnyvale, CA (US)

( * ) Notice: Subject to any disclaimer, the term of this patent is extended or adjusted under 35 U.S.C. 154(b) by 132 days.

(21) Appl. No.: 12/140,104

(22) Filed: Jun. 16, 2008

(65) Prior Publication Data

US 2009/0308455 A1    Dec. 17, 2009

(51) Int. Cl.
C30B 21/06    (2006.01)
C30B 27/02    (2006.01)

(52) U.S. Cl. .............................. 117/13; 117/15; 117/21; 117/33

(58) Field of Classification Search ................... 117/13, 117/33, 15, 21
See application file for complete search history.

(56) References Cited

U.S. PATENT DOCUMENTS

| | | | | |
|---|---|---|---|---|
| 4,379,777 A * | 4/1983 | Boulos | ........................ | 423/348 |
| 4,392,297 A | 7/1983 | Little | | |
| 4,910,153 A * | 3/1990 | Dickson | ........................ | 438/96 |
| 5,069,740 A | 12/1991 | Levine et al. | | |
| 5,500,102 A | 3/1996 | Ichikawa et al. | | |
| 5,556,791 A * | 9/1996 | Stevens et al. | ................. | 438/63 |
| 5,599,403 A * | 2/1997 | Kariya et al. | ................ | 136/258 |
| 5,614,020 A * | 3/1997 | Stevens et al. | .............. | 117/205 |
| 5,730,808 A * | 3/1998 | Yang et al. | .................. | 136/249 |
| 5,948,163 A * | 9/1999 | Sakurada et al. | ............ | 117/208 |
| 6,376,010 B1 * | 4/2002 | Blackwell et al. | ......... | 427/163.2 |
| 7,381,392 B2 * | 6/2008 | Enebakk et al. | .......... | 423/328.2 |
| 2007/0128099 A1 * | 6/2007 | Enebakk et al. | ............. | 423/324 |
| 2007/0169684 A1 * | 7/2007 | Stoddard | ...................... | 117/13 |
| 2007/0169685 A1 * | 7/2007 | Stoddard | ...................... | 117/13 |
| 2008/0029019 A1 * | 2/2008 | Dethloff et al. | ............... | 117/13 |
| 2008/0078444 A1 | 4/2008 | Atanackovic | | |
| 2008/0157241 A1 * | 7/2008 | Kirscht et al. | ............... | 257/431 |
| 2008/0157283 A1 * | 7/2008 | Moslehi | ...................... | 257/618 |
| 2008/0197454 A1 * | 8/2008 | Rakotoniana et al. | ....... | 257/617 |
| 2008/0206123 A1 * | 8/2008 | Enebakk et al. | ............. | 423/349 |
| 2008/0264477 A1 * | 10/2008 | Moslehi | ..................... | 136/255 |

(Continued)

FOREIGN PATENT DOCUMENTS

JP    2007137756 A    *    6/2007

(Continued)

*Primary Examiner*—Robert M Kunemund
*Assistant Examiner*—G. Nagesh Rao
(74) *Attorney, Agent, or Firm*—Schwegman, Lundberg & Woessner, P.A.

(57) ABSTRACT

Techniques for the formation of silicon ingots and crystals using silicon feedstock of various grades are described. Common feature is adding a predetermined amount of germanium to the melt and performing a crystallization to incorporate germanium into the silicon lattice of respective crystalline silicon materials. Such incorporated germanium results in improvements of respective silicon material characteristics, mainly increased material strength. This leads to positive effects at applying such materials in solar cell manufacturing and at making modules from those solar cells. A silicon material with a germanium concentration in the range (50-200) ppmw demonstrates an increased material strength, where best practical ranges depend on the material quality generated.

9 Claims, 5 Drawing Sheets

U.S. PATENT DOCUMENTS

| | | | |
|---|---|---|---|
| 2008/0295294 A1* | 12/2008 | Skelton et al. | 23/295 R |
| 2008/0295887 A1* | 12/2008 | Moslehi | 136/259 |
| 2008/0308143 A1* | 12/2008 | Atanackovic | 136/255 |
| 2008/0314445 A1* | 12/2008 | McNulty et al. | 136/261 |
| 2008/0314446 A1* | 12/2008 | McNulty et al. | 136/261 |
| 2009/0308455 A1* | 12/2009 | Kirscht et al. | 136/261 |

FOREIGN PATENT DOCUMENTS

| | | | |
|---|---|---|---|
| JP | 2007142370 A * | 6/2007 | |
| WO | WO-2010005736 A2 | 1/2010 | |

* cited by examiner

GERMANIUM-ENRICHED SILICON MATERIAL FOR MAKING SOLAR CELLS

FIELD

The present disclosure relates to methods and systems for use in the fabrication of semiconductor materials such as silicon, for example using lower-grade silicon. More particularly, the present disclosure relates to a method and system for forming a silicon crystal or ingot with improved characteristics, including greater strength and flexibility, using feedstock material of various grades and germanium enrichment.

DESCRIPTION OF THE RELATED ART

The photovoltaic (PV) industry is growing rapidly and is responsible for an increasing amount of silicon being consumed beyond the more traditional uses as integrated circuit (IC) applications. Today, the silicon needs of the solar cell industry are partially competing with the silicon needs of the IC industry. With present manufacturing technologies, both IC and PV industries require a refined, purified, silicon feedstock as a raw silicon starting material.

Materials alternatives for the bulk of current solar cells range from mono-crystalline silicon wafers, for example based on very clean raw silicon such as electronic-grade (EG) silicon feedstock needed for the IC industry, to multi-crystalline (mc) silicon wafers based on not as clean raw silicon such as the so-called solar-grade (SOG) silicon feedstock or an even lower-quality material called upgraded metallurgical-grade (UMG) silicon feedstock.

Low-grade feedstock materials for the PV industry, such as UMG silicon, are typically processed into ingots and wafers of mc-silicon where the ultimate, solar cell relevant quality is typically controlled by grain boundaries, other structural defects and a relatively high concentration of impurities such as transition metals. Also carbon related and oxygen related defects in the wafer bulk can degrade cell properties, in particular when associated with metals. Some species of the broad defect spectrum may be passivated with hydrogen to reduce their electrical degradation potential.

Higher-grade feedstock materials for the solar cell industry, such as EG silicon, are typically processed into mono-crystals and, subsequently, wafers with mono-crystalline structure where the ultimate, solar cell relevant quality is controlled by impurities similar to the case of mc-silicon described above. There are two well-established growing techniques for mono-crystals of silicon (in the following called crystals). By far dominant is the Czochralski (CZ) technique where a CZ crystal is pulled out of a silicon melt residing in a quartz crucible. Medium to high-grade feedstock silicon is employed for generating the CZ silicon melt. A more sophisticated alternative is the Floating Zone (FZ) technique where a FZ crystal is grown by "floating" a small melt zone through a so-called supply rod of high-grade feedstock silicon. One way of getting predetermined amounts of elements into FZ crystals is so-called "pill doping" into supply rods before generating the melt zone. Typically, FZ silicon crystals contain less impurities than CZ crystals, mainly because no crucible is required.

In any case, since silicon is brittle at room temperature, there is the general problem of wafer breakage at wafer and solar cell processing and handling, including the manufacturing of modules out of solar cells. Consequently, the mechanical strength of silicon wafers and related solar cells is also an important quality factor in the PV industry, besides electrical properties. This holds for mono-crystalline material and equally for multi-crystalline ingot material.

Wafer breakage is initiated by crack formation and subsequent propagation. Cracks may originate from, for example, handling-induced local damage on surfaces, in particular at edges and corners. State-of-the-art solar cell manufacturing technology uses careful handling and processing of wafers and solar cells to avoid such situations. Intrinsic material strength of bulk silicon is also a function of bulk lattice defects. Of particular concern are defects that generate local tensile lattice strain, enabling internal crack formation/propagation at reduced external force (relative to an ideal lattice structure).

A need exists for a simple process that delivers UMG-based multi-crystalline silicon material with good ingot yield and improved mechanical and electrical properties, the latter in regard to solar cell quality. Such a process should be easily transferable to higher-grade, non-UMG feedstock silicon which is used partially or exclusively for producing mono-crystalline silicon materials, for example by applying the CZ technique or the FZ technique.

SUMMARY

A technique is here disclosed for the crystallization of silicon which may be useful for ultimately making solar cells. The present disclosure includes a method and system for making silicon ingots or crystals with improved electrical and mechanical material characteristics, for use in a variety of solar cell applications.

The resulting solar cells may be shipped, installed, and used without concern for strong susceptibility to breakage. In addition to delivering improved mechanical strength, improved electrical properties of the silicon material resulting from related ingots or crystals may also lead to higher ingot/crystal yield, measured as ingot/crystal portion with a recombination lifetime of certain minimum level needed to reach critical cell efficiencies.

According to one aspect of the disclosed subject matter, a silicon ingot forming method and associated system are provided for using a low-grade silicon feedstock that includes forming within a crucible device a molten solution from a low-grade silicon feedstock and a predetermined amount of germanium. The process and system perform a directional solidification of the molten solution to form a silicon ingot within the crucible device.

According to another aspect of the disclosed subject matter, a silicon crystal forming method and associated system are provided for using a higher-grade silicon feedstock and a predetermined amount of germanium. The process and system perform a crystallization of the molten solution to form a silicon crystal.

In one case, crystallization is achieved using the CZ technique, where a predetermined amount of germanium is added to the higher-grade silicon feedstock before meltdown and subsequent CZ crystal pulling.

In another case, crystallization is achieved using the FZ technique, where the predetermined amount of germanium is attached to the high-grade silicon supply rod before applying the floating melt zone for FZ crystal growing.

The predetermined amount of germanium can be added as pure germanium only. It can be also part of a compound such as a pure silicon-germanium alloy.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which reference characters identify correspondingly throughout and wherein.

Figure 3:
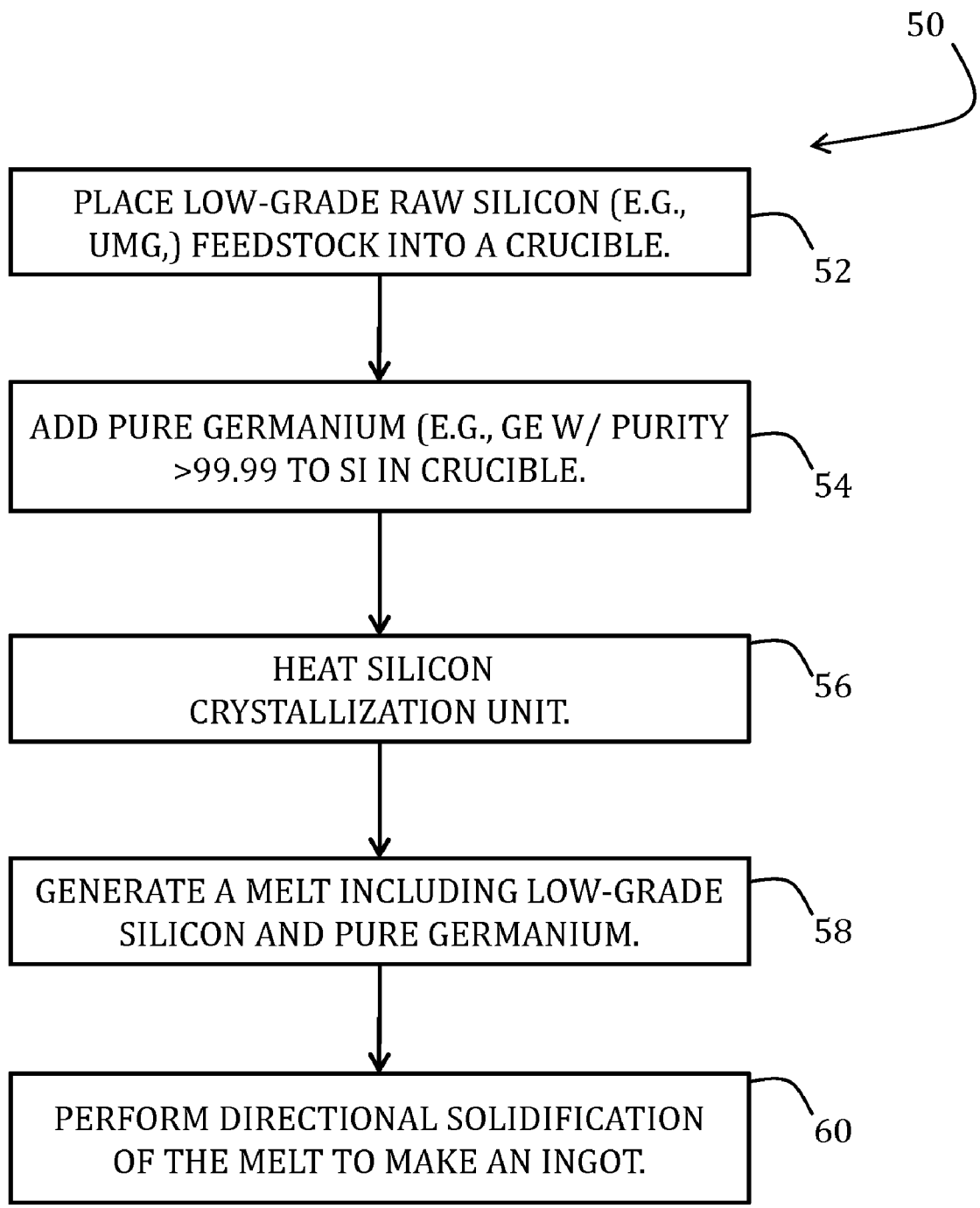
Figure 4:
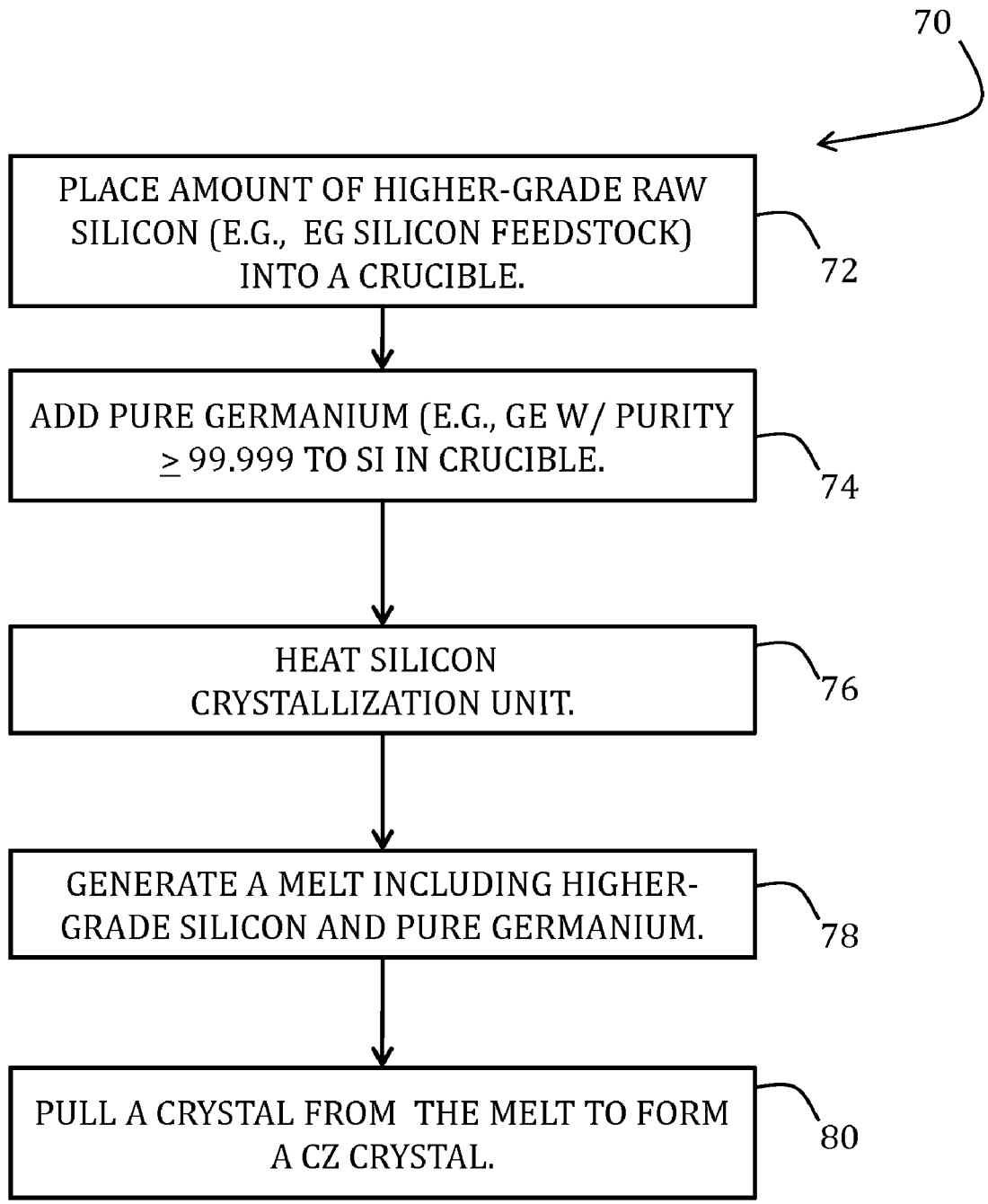
Figure 5:
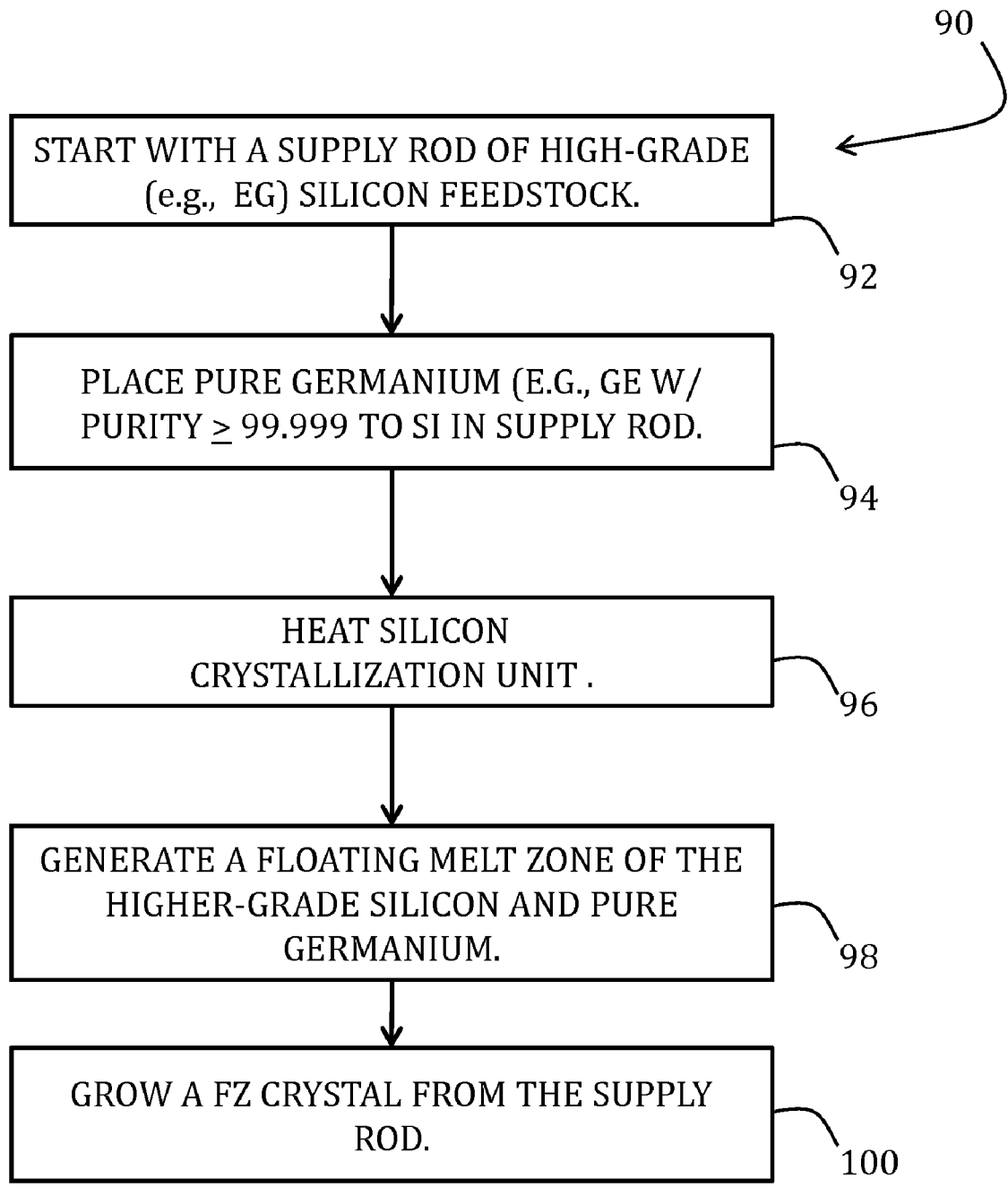
Figure 6:
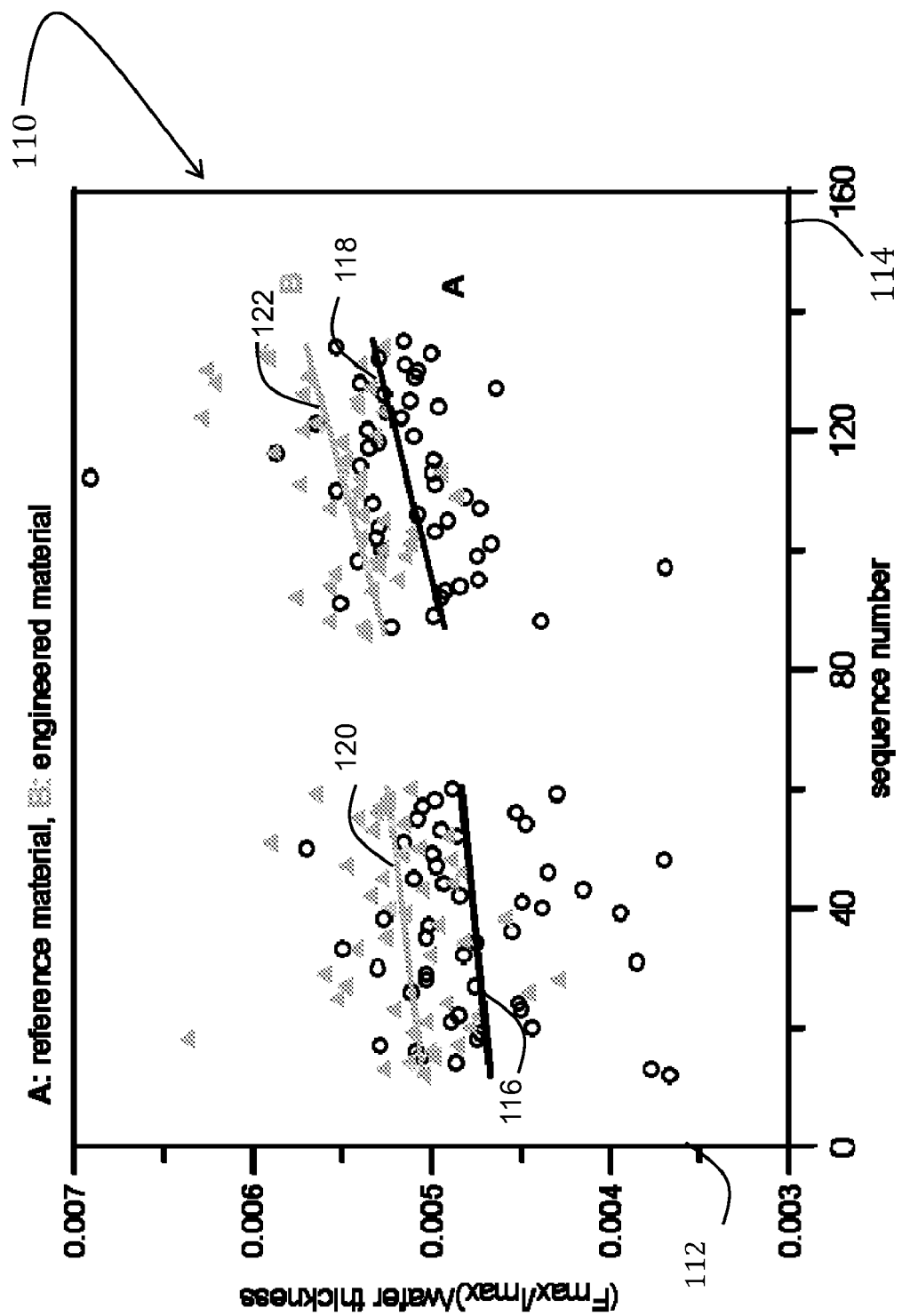

FIG. 3 provides a process flow for one embodiment the present disclosure employing low-grade raw silicon feedstock for a directional solidification ingot formation process;

FIG. 4 provides a process flow for one embodiment of the present disclosure employing higher-grade raw silicon feedstock for a CZ crystal pulling process;

FIG. 5 provides a process flow for one embodiment the present disclosure employing a supply rod of high-grade raw silicon feedstock for an FZ crystal growing process;

FIG. 6 shows a diagram of breakage test results on a plurality of different wafers tested from a reference ingot and an engineered ingot using an embodiment of the present disclosure.

DETAILED DESCRIPTION OF THE SPECIFIC EMBODIMENTS

The method and system of the present disclosure provide a semiconductor ingot formation process for producing a silicon ingot or crystal using a low purity or high purity silicon feedstock. As a result of using the presently disclosed subject matter, an improvement in the properties of ingots formed from low-grade semiconductor materials, such as upgraded metallurgical grade silicon (UMG) occurs. Such improvement allows use of UMG silicon, for example, in producing solar cells for applications in solar power generation. The method and system of the present disclosure, moreover, particularly benefits the formation of silicon-based solar cells using UMG or other non-electronic grade feedstock materials. The present disclosure may, therefore, allow the manufacture of solar cells in greater quantities and in a greater number of fabrication facilities than has heretofore been possible.

Figures 1, 2:
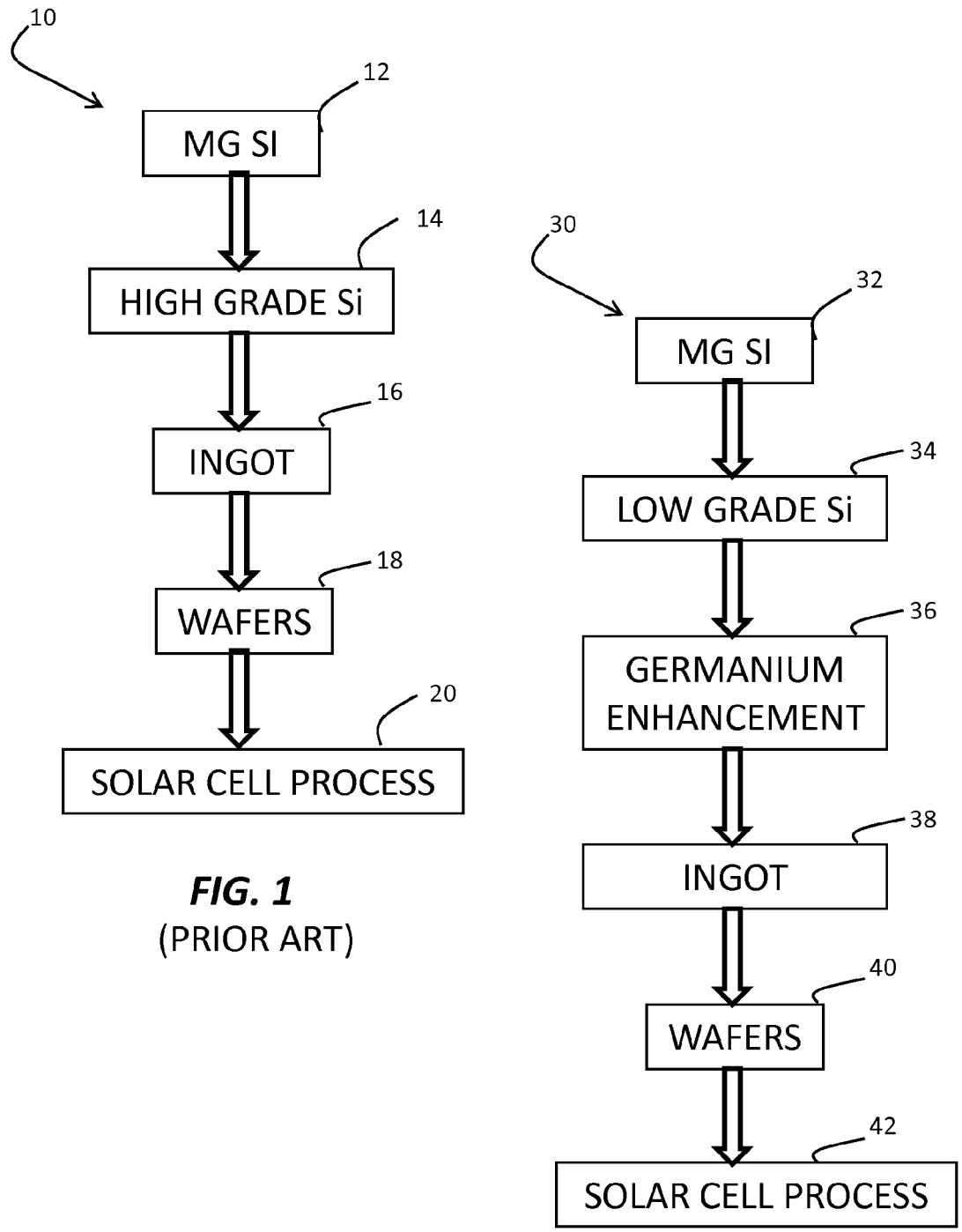
FIG. 1 is a prior art general process for the formation of a solar cell beginning with the formation of a silicon ingot.
FIG. 2 illustrates conceptually a process flow for producing a silicon ingot with improved characteristics according to the present disclosure.

Laying a context for the present disclosure, FIG. 1 depicts a known process 10 beginning at step 12. At step 12, MG or other low-grade silicon enters known wafer forming process flow 10. Known process flow 10 extracts high-grade silicon from MG silicon at step 14. High-grade silicon extraction step 14 is a high-cost processing sequence resulting in EG silicon or somewhat relaxed silicon quality called SOG feedstock quality. Those are the types of silicon feedstock materials used for making the ingot in step 16. Known process flow 10 includes slicing the silicon ingot, generally using a wire-saw to derive a silicon wafer at step 18. The resulting silicon wafers then enter solar cell formation process 20 using the resulting wafer.

FIG. 2 depicts, in general terms, novel aspects of how the disclosed process may be integrated into the overall solar cell fabrication flow 30. The improved silicon ingot characteristics arising from the present disclosure may include greater strength and flexibility of the resulting wafers, and hence the resulting solar cells, using feedstock material of various grades and the presently disclosed germanium enrichment steps.

Fabrication flow 30 includes using MG silicon at step 32 that may be purified to some degree to become UMG silicon. The resulting silicon quality still results in low-grade silicon 36. Accordingly, silicon quality 34 relates to much lower cost as compared to silicon quality 14. Also, low-grade silicon ingot 36 includes a much higher content of metallic and non metallic impurities as compared to silicon quality 14. The present disclosure includes the addition or enhancement of a predetermined quality and quantity of germanium for the purpose of improving the resulting strength and flexibility of the resulting ingot. The combination of silicon and germanium are heated to form a silicon melt as an initial aspect of ingot formation step 38.

At step 38, silicon ingot formation may occur using, for example, a directional solidification process, a CZ crystal formation process, or a FZ crystal formation process. Step 40 represents the formation of silicon wafers. Finally, the solar cell forming process occurs at step 42.

FIG. 3 provides a process flow 50 for one embodiment the present disclosure employing low-grade raw silicon feedstock. In process flow 50, a first step 52 includes placing low-grade raw silicon (e.g., UMG silicon) into a crucible. Before the heating process for silicon melt formation begins, the present disclosure contemplates the addition, at step 54, of a predetermined amount of pure germanium (e.g., germanium with a purity of 99.999) to the low-grade silicon feedstock.

The total range of added germanium in improved silicon may range from 50 to 200 ppmw. In one embodiment of the disclosed subject matter, the amount of germanium may range from 100 to 150 ppmw. Another embodiment may allow for a range of germanium from 120 to 180 ppmw.

Once the combination of solid low-grade silicon and pure germanium reside in the crucible, step 56 includes heating the solid mixture for generating a melt of the low-grade silicon and added germanium at step 58. The molten low-grade silicon and germanium may be subsequently crystallized, step 60, by performing a directional solidification, for example.

FIG. 4 provides a process flow 70 for a further embodiment of the present disclosure employing higher-grade raw silicon feedstock. In process flow 70, a first step 72 includes placing higher-grade raw silicon (e.g., EG silicon) into a crucible. Before the heating process for silicon melt formation begins, the present disclosure contemplates the addition, at step 74 of a predetermined amount of pure germanium (e.g., germanium with a purity at least of 99.999) to the higher-grade silicon feedstock.

Once the combination of solid low-grade silicon and pure germanium reside in the crucible, step 76 includes heating the solid mixture for generating a melt of the higher-grade silicon and added germanium, step 78. A portion of molten higher-grade silicon and germanium may be subsequently formed into a silicon crystal, step 80, by pulling a CZ crystal using established procedures for achieving and maintaining desired crystal properties throughout the CZ process.

FIG. 5 provides a process flow 90 for a further embodiment the present disclosure starting with a supply rod of high-grade raw silicon, specifically EG silicon feedstock. In process flow 90, a first step 92 includes beginning with a high-grade raw silicon (e.g., EG silicon) supply rod. The supply rod allows the use of a floating zone or FZ region for an FZ crystallization process. In association with forming the FZ region, the present disclosure contemplates the addition, at step 94, of a predetermined amount of pure germanium (e.g., germanium with a purity at least of 99.999) to the supply rod of high-grade raw silicon feedstock.

Once the combination of solid high-grade silicon and pure germanium exist in the FZ, step 96 includes using the floating melt zone of the higher-grade silicon and added germanium, step 98, to subsequently form a silicon crystal, step 80, by growing an FZ crystal from the supply rod and germanium mixture. At this point, the established procedures for achieving and maintaining desired crystal properties throughout the FZ process may find application.

FIG. 6 depicts a characteristic result 110 of an experiment comparing the mechanical wafer strength of germanium-doped material from ingot B with non-doped reference material from ingot A. For both ingots the very same type of UMG feedstock silicon has been selected, and the casting was done sequentially with the same tool applying the same casting conditions. Then, from each ingot one set of near-bottom wafers (116 and 120) and one set of near-top wafers (118 and 122) were selected for determining the mechanical wafer strength, measured as ratio of maximum external force $F_{max}$ over maximum wafer deformation $l_{max}$ in a standard 4-line bending test. The normalized wafer strength (strength divided by wafer thickness) 112 is presented for the various wafer groups where the sequence number 114 describes the original location within respective ingots (increasing numbers from bottom to top). From the graph we see that wafers from the germanium-doped ingot B exhibit higher strength than wafers from the reference ingot A. The results shown here support the conclusion that the addition of germanium in the formation of a silicon ingot yield greater strength characteristics than a silicon ingot made from an otherwise identically formed silicon ingot.

These results are further substantiated by the Table below, which shows an example of additional improvements achieved with material from a germanium-doped silicon ingot.

TABLE

| INGOT YIELD, CARRIER LIFETIME, AND EFFICIENCY INCREASE | | |
|---|---|---|
| Increase of ingot yield | Increase of recombination lifetime | Increase in efficiency |
| 44.7% | 20.7% | 1.2% |

The Table reports data for a medium-grade feedstock that was used in formation of a multi-crystalline silicon ingot. Those data relate to improvements of electrical material characteristics, on top of improved mechanical characteristics described above. In the Table, measured improvements of such electrical characteristics are given as percentage of increase in mechanical durability engineered silicon, as compared to silicon that has not been modified consistent with the present disclosure. Because of the improved material properties, there results a corresponding yield increase in possible number of silicon wafers and related solar cells from such an ingot. Moreover, improved electrical characteristics translate into an average yield increase for the resulting solar cells.

In other words, the improved material characteristics of a silicon ingot formed consistent with the teachings of the present disclosure have a cascading effect to promote a corresponding reduction in the final costs associated with the manufacture of solar cells and systems using such solar cells. That is, because the germanium-doped silicon material exhibits improved material strength and flexibility over non-doped silicon material, a greater likelihood exists that the mechanical processes of slicing the wafers from the ingot will result in less wafer breakage. Then, once the wafers are sliced, the continuing material strength and flexibility of the silicon wafers provide increased durability as such silicon wafers are further formed into solar cells. Moreover, such resulting solar cells are less likely to break, crack, or demonstrate fracture stress upon installation or shipping from the solar cell manufacturing site to the points of assembly as solar cell arrays and the final installation in the field of such solar cell arrays. Lastly, the increased durability and flexibility of such solar cells may further increase the operational life of the solar cell arrays, as weathering, thermal and environmental transients in the field may damage or otherwise occur.

From the increased yield of silicon wafers, the increased yield of solar cells, the increased yield of solar cell arrays, and the increased mechanical durability of the solar cell arrays embodying the teachings of the present disclosure, highly significant economies may arise in the solar cell industry. Such economies directly and materially translate to reduced costs in the generation of electricity from solar cells.

As the above Table depicts, the germanium-doping of silicon may cause an increase in not only the carrier lifetime of respective silicon material but also the overall solar cell efficiency. This is seen, for example, in the demonstrated increase in recombination lifetime of 20.7% and a measured cell efficiency increase of 1.2% in the above Table.

The silicon material improvements of the present disclosure may derive from increased compressive lattice strain associated with substitutionally incorporating germanium atoms in the lattice structure of crystalline silicon. Such substitutional incorporation of germanium may compensate local tensile stresses associated with certain bulk defects in silicon wafers or solar cells and result in improved control of the intrinsic material strength.

Empirical results indicate that a silicon material with a germanium concentration in the range (50-200) ppmw demonstrates an increased material strength, where the best practical range depends on the material quality generated. Slightly higher germanium concentrations turn out to work better for mono-crystalline silicon, as compared to multi-crystalline silicon.

In summary, the disclosed subject matter provides a method and system for forming a silicon ingot or crystal which includes forming within a crucible device a molten solution from silicon feedstock and a predetermined amount of germanium, followed by either directional solidification to form an ingot within the crucible, pulling CZ crystals from the melt, or growing FZ crystals.

Although various embodiments that incorporate the teachings of the present disclosure have been shown and described in detail herein, those skilled in the art may readily devise many other varied embodiments that still incorporate these teachings. The foregoing description of the preferred embodiments, therefore, is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein, but is to be accorded the widest scope consistent with the principles and novel features disclosed herein.

What is claimed is:

1. A method for forming crystalline silicon having improved mechanical and electrical characteristics, comprising the steps of:
   initiating a silicon crystallization process using a predetermined amount of a silicon feedstock material;
   adding to said silicon feedstock material a predetermined quantity of germanium with a minimum purity level of 99.99%, wherein the quantity of germanium ranges from 50 to 200 ppmw;
   generating a melt from respective silicon feedstock material and said quantity of germanium; and
   performing a crystallization of said melt.

2. The method of claim 1, further comprising the step of initiating a directional solidification silicon crystallization process using a predetermined amount of silicon feedstock material.

3. The method of claim 1, further comprising the step of initiating a directional solidification silicon crystallization process using a predetermined amount of UMG silicon feedstock material.

4. The method of claim 1, further comprising the step of initiating a CZ silicon crystal pulling process using an EG silicon feedstock material.

5. The method of claim 1, further comprising the step of initiating a CZ silicon crystal pulling process using an SOG silicon feedstock material.

6. The method of claim 1, further comprising the step of initiating an FZ silicon crystallization process using an EG silicon supply rod.

7. The method of claim 1, further comprising the step of adding to said silicon feedstock material the quantity of germanium with a minimum purity level of 99.999 percent purity.

8. The method of claim 1, further comprising the step of adding to said silicon feedstock material the quantity of germanium ranging from 100 to 150 ppmw.

9. The method of claim 1, further comprising the step of adding to said silicon feedstock material the quantity of germanium ranging from 120 to 180 ppmw.

* * * * *